United States Patent
Lin et al.

(10) Patent No.: US 6,421,296 B1
(45) Date of Patent: Jul. 16, 2002

(54) DOUBLE PROTECTION VIRTUAL GROUND MEMORY CIRCUIT AND COLUMN DECODER

(75) Inventors: Lai-Ching Lin, Kaohsiung Hsien; Yu-Wei Lee, Taichung; Sheau-Yung Shyu, Hsinchu, all of (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/849,056

(22) Filed: May 4, 2001

(51) Int. Cl.[7] .................................................. G11C 3/00
(52) U.S. Cl. ...................... 365/230.06; 365/54
(58) Field of Search .............................. 365/54, 185.16, 365/230.06, 230.08

(56) References Cited

U.S. PATENT DOCUMENTS

| | | | | |
|---|---|---|---|---|
| 5,379,254 A | * | 1/1995 | Chang .................... | 365/185.16 |
| 5,623,443 A | * | 4/1997 | Vazerounian et al. .. | 365/185.16 |
| 5,793,666 A | * | 8/1998 | Yamazaki .............. | 365/185.16 |
| 6,081,474 A | * | 6/2000 | Togami et al. ......... | 365/185.16 |

* cited by examiner

*Primary Examiner*—Tan T. Nguyen
(74) *Attorney, Agent, or Firm*—J. C. Patents (57) ABSTRACT

A double protection virtual ground memory circuit and column decoder. Through the introduction of a double protection circuit, leakage current from the virtual ground memory is reduced and power consumed by the memory circuit is lowered. Ultimately, sensing range of data within the memory by a sense amplifier is improved.

14 Claims, 5 Drawing Sheets

DOUBLE PROTECTION VIRTUAL GROUND MEMORY CIRCUIT AND COLUMN DECODER

CROSS-REFERENCE TO RELATED APPLICATION

This application claims the priority benefit of Taiwan application serial no. 90105277, filed on Mar. 7, 2001.

BACKGROUND OF THE INVENTION

1. Field of Invention

The present invention relates to a type of virtual ground memory. More particularly, the present invention relates to a double protection virtual ground memory circuit and column decoder.

2. Description of Related Art

Figure 1:
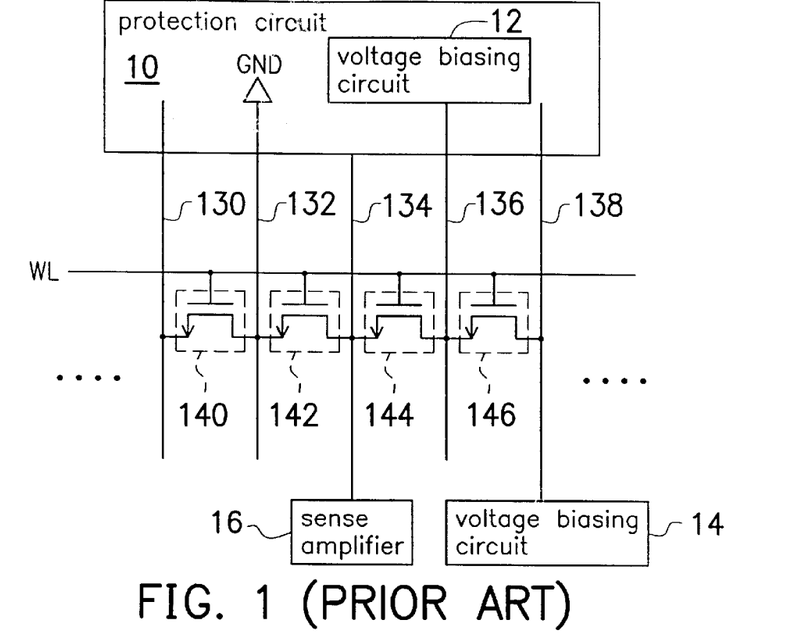
FIG. 1 is a schematic circuit diagram of a conventional virtual ground memory.

In general, the current produced while reading from a virtual ground memory cell is often interfered with by voltage on neighboring bit lines. FIG. 1 is a schematic circuit diagram of a conventional virtual ground memory. For example, to read data from a memory cell 142, the bit line 132 is pulled down to a ground voltage while the bit line 134 is pulled up by the voltage biasing circuit 12. Therefore, the current path starting from the sense amplifier 16 and going through the bit line 134, the memory cell 142 and the ground-connected bit line 132 is able to sense any data within the memory cell 142. Although the bit lines 136 and 138 are pulled up to a reference voltage identical to the voltage at the sense amplifier 16 by the voltage biasing circuit 12 when the sense amplifier 16 is in operation so that current is prevented from flowing into the bit lines 136 and 138, voltage variation on the bit line 130 is likely to affect the potential on the bit line 132. In other words, the electric potential of the bit line 132 is pulled up when the electric potential on the bit line 130 is greater than zero. In addition, each bit line must couple electrically with a different voltage source (for example, the ground, the sense amplifier 16, or the voltage biasing circuits 12 and 14). Hence, a relatively complicated circuit decoder with high consumption of energy has to be designed.

Figure 2:
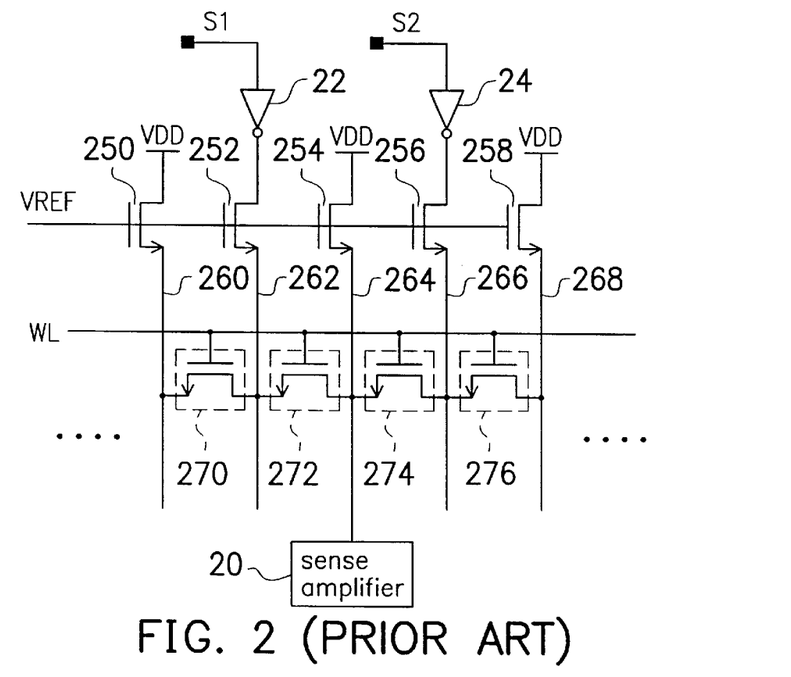
FIG. 2 is a schematic diagram of an alternative conventional virtual ground memory circuit.

FIG. 2 is a schematic diagram of an alternative conventional virtual ground memory circuit. As shown in FIG. 2, voltage biasing of the bit lines (for example, bit lines 260 to 268) are controlled by the application of a reference voltage VREF to the gate terminals of various transistors (for example, transistors 250 to 258). To read data from a memory cell 272, the bit line 262 is grounded while the bit line 264 is coupled to the sense amplifier 20. Hence, a current path starting from the sense amplifier 20 and going through the bit line 264, the memory cell 272 and the bit line 262 to ground is established. However, this type of circuit structure has two major drawbacks. First, the bit line 260 is biased, thereby affecting the electric potential of the bit line 262 and reducing current flow. Ultimately, sensing speed and accuracy are compromised. Second, the reference voltage applied to the gates of the various transistors 250 to 258 are difficult to control. When the reference voltage varies, current passing through the transistor 254 also varies, leading to a fluctuation of the detectable range of the sense amplifier 20.

SUMMARY OF THE INVENTION

Accordingly, one object of the present invention is to provide a double protection virtual ground memory circuit and column decoder. By incorporating a multiple protection circuit, leakage current inside the virtual ground memory is greatly reduced.

To achieve these and other advantages and in accordance with the purpose of the invention, as embodied and broadly described herein, the invention provides a type of virtual ground memory having a double protection circuit therein. The virtual ground memory includes at least a memory unit. Data within various memory cells inside the memory unit are sensed by a sense amplifier through a sense terminal. The memory unit includes a plurality of memory cells. A first memory cell having a first conductive terminal, a second conductive terminal and a gate terminal is provided. The first conductive terminal of the first memory cell is electrically coupled to the sense terminal and the second conductive terminal of the first memory cell is connected to ground. The gate terminal of the first memory cell is electrically coupled to a word line. A second memory cell having a first conductive terminal, a second conductive terminal and a gate terminal is provided. The first conductive terminal of the second memory cell is electrically coupled to the output terminal of a voltage biasing circuit. The second conductive terminal of the second memory cell is electrically coupled to the sense terminal and the gate terminal of the second memory cell is electrically coupled to the word line. A third memory cell having a first conductive terminal, a second conductive terminal and a gate terminal is provided. The first conductive terminal of the third memory cell is electrically coupled to the second conductive terminal of the first memory cell and the second conductive terminal of the third memory cell is connected to the ground. The gate terminal of the third memory cell is electrically coupled to the word line. A fourth memory cell having a first conductive terminal, a second conductive terminal and a gate terminal is provided. The first conductive terminal of the fourth memory cell is electrically coupled to the output terminal of the voltage biasing circuit. The second conductive terminal of the fourth memory cell is electrically coupled to the first conductive terminal of the second memory cell and the gate terminal of the fourth memory cell is electrically coupled to the word line.

This invention also provides a double protection virtual ground memory circuit that uses a sense amplifier for sensing memory cell data. The virtual ground memory includes a plurality of bit lines, a voltage biasing circuit, a switching circuit and at least one memory unit. The voltage biasing circuit outputs a bias voltage. The switching circuit has a first output terminal and a second output terminal. The switching circuit receives the bias voltage from the voltage biasing circuit and outputs a signal of different phase from its first output terminal and second output terminal. The memory unit includes a selection circuit and a plurality of pass transistors. The selection circuit receives the signals from the first and second output terminal of the switching circuit and selects the bit lines according to the potential level. A first pass transistor having a first conductive terminal, a second conductive terminal and a gate terminal is provided. The second conductive terminal of the first pass transistor is electrically coupled to a sense amplifier. The gate terminal of the first pass transistor receives a first selection signal. A second pass transistor having a first conductive terminal, a second conductive terminal and a gate terminal is provided. The second conductive terminal of the second pass transistor is electrically coupled to the sense amplifier. The gate terminal of the second pass transistor receives a second selection signal. A third pass transistor having a first conductive terminal, a second conductive terminal and a gate terminal is provided. The second conductive terminal of the third pass transistor is electrically connected to the sense amplifier. The gate terminal of the third pass transistor receives a third selection signal.

This invention also provides a double protection virtual ground memory circuit having a column decoder therein. The virtual ground memory includes a plurality of bit lines, a voltage biasing circuit, a switching circuit and a selection circuit. The voltage biasing circuit outputs a bias voltage. The switching circuit has a first output terminal and a second output terminal. The switching circuit receives the bias voltage and outputs signals each having a different phase from the first output terminal and the second output terminal. The selection circuit receives the signals from the first and second output terminals of the switching circuit for selecting the potential level of the bit lines.

In brief, the double ground-connected protection circuit minimizes the leakage current produced when data within a particular memory cell is sensed. In addition, the column decoder design inside the circuit has a simple design so that a lot of circuit planning and manufacturing steps are eliminated.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 3:
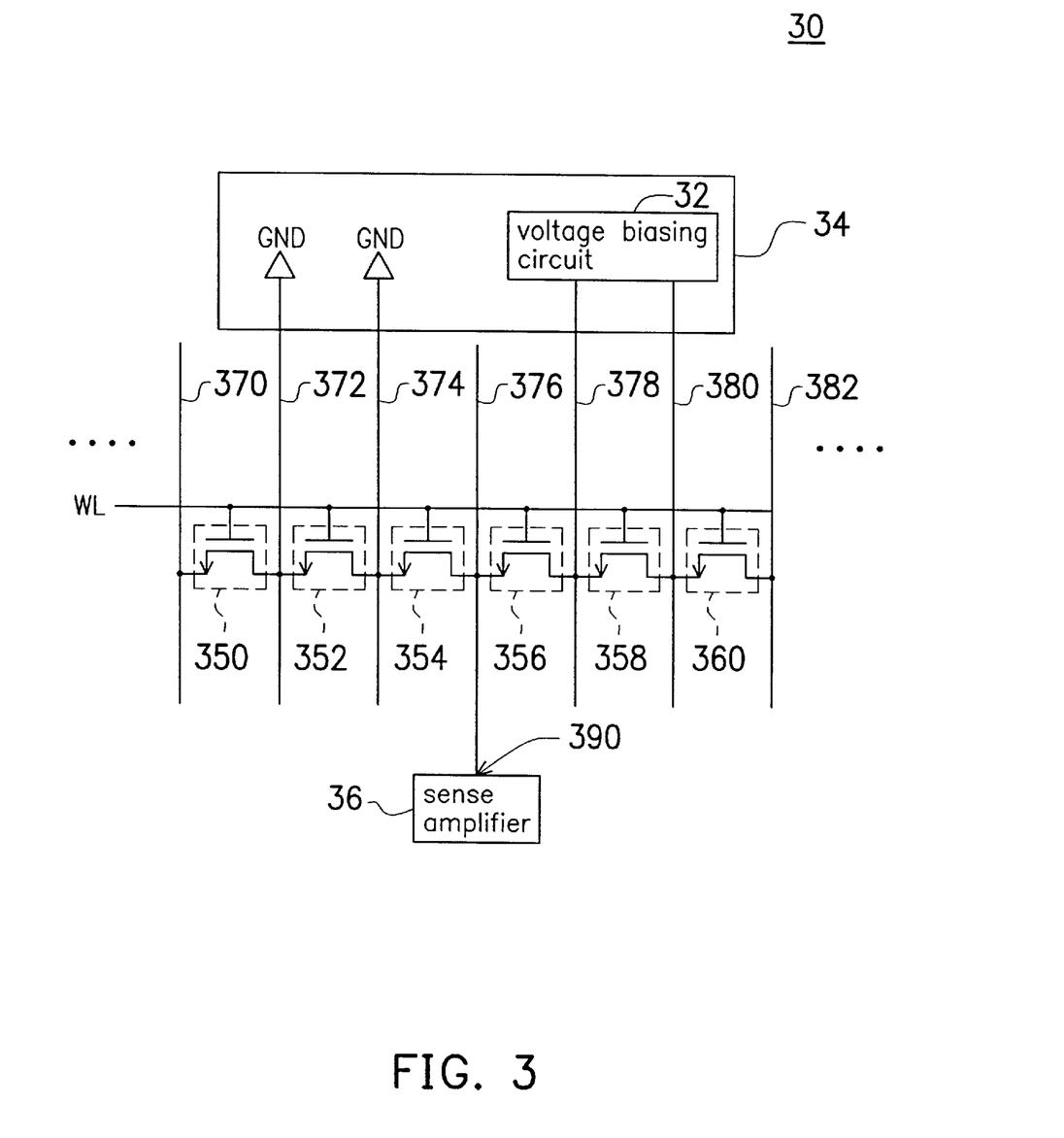
FIG. 3 is a schematic diagram showing a portion of the double protection virtual ground memory circuit according to a first preferred embodiment of this invention.

FIG. 3 is a schematic diagram showing a portion of the double protection virtual ground memory circuit according to a first preferred embodiment of this invention. As shown in FIG. 3, the double protection virtual ground memory 30 includes a plurality of memory cells (for example, memory cells 350 to 360), a plurality of bit lines (for example, bit lines 370 to 382) and a protection circuit 34. The protection circuit 34 further includes a voltage biasing circuit 32 for providing a bias voltage to a portion of the bit lines (such as the bit lines 378 and 380). In this embodiment, the memory cells (or transistors) are represented by NMOS transistors. Hence, each memory cell (or transistor) has a drain (or a first conductive terminal), a source (or a second conductive terminal) and a gate (or a gate terminal). The source of memory cell 352 is electrically coupled to the bit line 372. The drain of the memory cell 352 and the source of the memory cell 354 are electrically coupled to the bit line 374. The drain terminal of the memory cell 354 and the source terminal of the memory cell 356 are electrically coupled to the bit line 376. The drain terminal of the memory cell 356 and the source terminal of the memory cell 358 are electrically coupled to the bit line 378. The drain terminal of the memory cell 358 is electrically coupled to the bit line 380. In the embodiment shown in FIG. 3, the circuit for reading data from the memory cell 354 is used as an illustration. Hence, the bit lines 372 and 374 must be connected to a ground. The bit lines 378 and 380 are electrically coupled to the voltage biasing circuit 32 and the bit line 376 is electrically coupled to sense terminal 390 of a sense amplifier 36. With this arrangement, a current path starting from the sense amplifier 36 and going through the bit line 376 and the memory cell 354 to arrive at the ground-connected bit line 374 is created. Due to the grounding of the bit line 372, electric potential on the bit line 374 is unaffected by any voltage fluctuation on the bit line 372.

Figure 4:
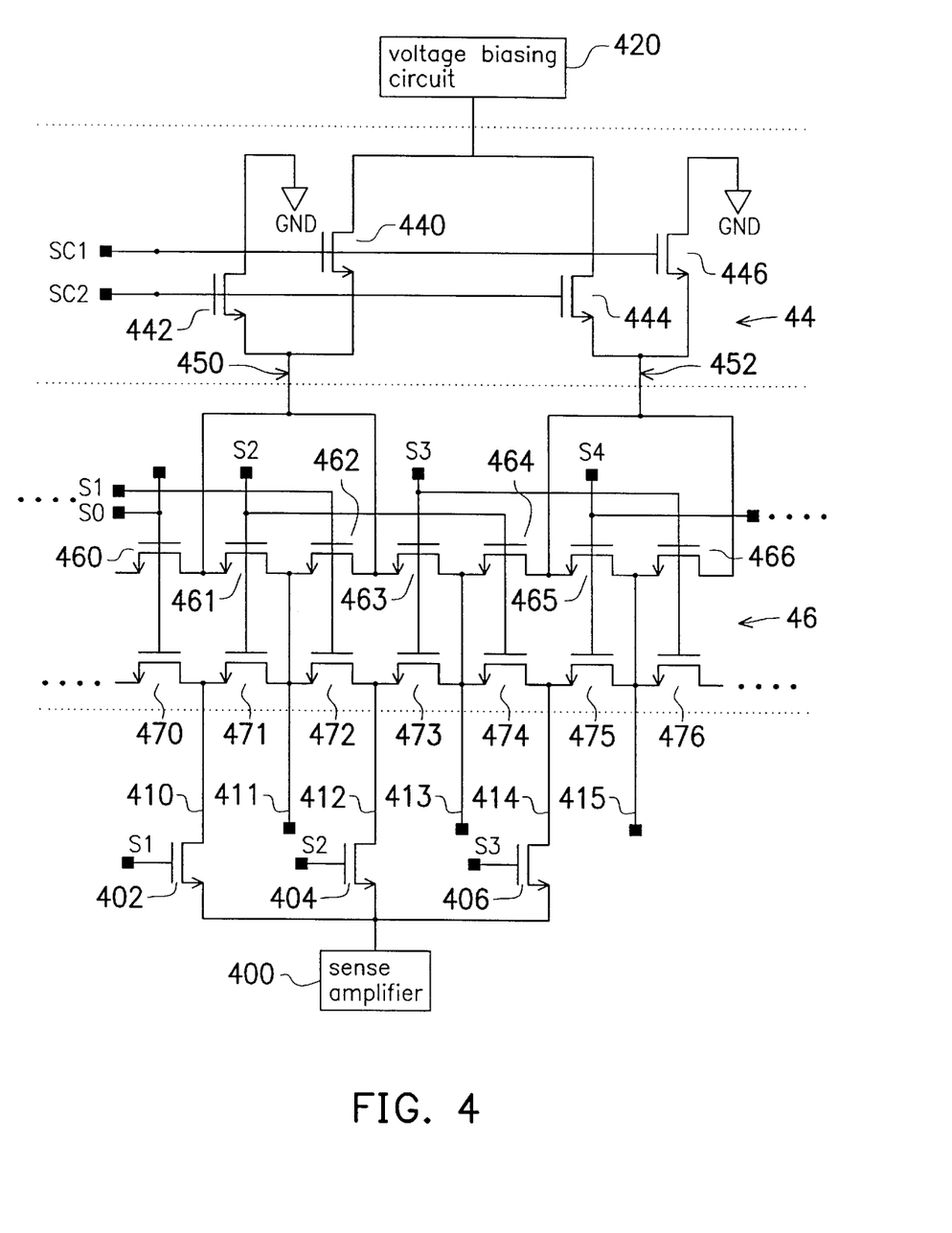
FIG. 4 is a schematic diagram showing a portion of the double protection virtual ground memory circuit that incorporates a column decoder according to a second preferred embodiment of this invention.

To simplify decoding procedure and lower power consumption, this invention also provides a column decoder. FIG. 4 is a schematic diagram showing a portion of the double protection virtual ground memory circuit that incorporates a column decoder according to a second preferred embodiment of this invention. Note that in the following a memory unit refers not to a single memory cell but the circuit for reading data from a memory cell. As shown in FIG. 4, the virtual ground memory includes a plurality of bit lines 410 to 415, a voltage biasing circuit 420, a switching circuit 44, a selection circuit 46 and a plurality of transistors 402 to 406. Each of the transistors 402 to 406 receives a selection signal for whether to produce a conductive path to a sense amplifier 400 or not. Hence, the transistors (402 to 406) are referred to as pass transistors from now on. The source terminal of pass transistor 402 couples electrically with the sense amplifier 400 and the gate terminal of the pass transistor 402 receives a selection signal S1. The source terminal of the pass transistor 404 couples electrically with the sense amplifier 400 and the gate terminal of the pass transistor 404 receives a selection signal S2. The source terminal of the pass transistor 406 couples electrically with the sense amplifier 400 and the gate terminal of the pass transistor 406 receives a selection signal S3.

The voltage biasing circuit 420 outputs a bias voltage to the switching circuit 44. The switching circuit 44 receives the bias voltage and outputs a signal from its first output terminal 450 and its second output terminal 452. The signals issued from the first output terminal 450 and the second output terminal 460 are of different phases. The switching circuit 44 includes a plurality of transistors 440 to 446. These transistors 440 to 446 are controlled by switching signals SC1 and SC2 so that an output voltage is fed either to the first output terminal 450 or to the second output terminal 452. Hence, the transistors 440 to 446 are referred to as switching transistors in subsequent description. The drain terminal of the switching transistor 440 receives the bias voltage while the source terminal of the switching transistor 440 couples electrically with the first output terminal 450. The gate terminal of the switching transistor 440 receives the control signal SC1. The drain terminal of the switching transistor 444 receives the bias voltage while the source terminal of the switching transistor 444 couples electrically with the second output terminal 452. The gate terminal of the switching transistor 444 receives the control signal SC2. Similarly, the drain terminal of the switching transistor 442 is grounded while the source terminal of the switching transistor 442 is electrically coupled to the first output terminal 450. The gate terminal of the switching transistor 442 receives the control signal SC2. The drain terminal of the switching transistor 446 is grounded while the source terminal of the switching transistor 446 is electrically coupled to the second output terminal 452. The gate terminal of the switching transistor 446 receives the control signal SC1. When the potential level on signal line SC1 is high while the potential level on signal line SC2 is low, the voltage biasing circuit 420 outputs a bias voltage to the first output terminal 450 via the switching transistor 440. Meanwhile, the second output terminal 452 is connected to the ground via the switching transistor 446. Conversely, when the potential level on signal line SC1 is low while the potential level on signal line SC2 is high, the first output terminal 450 is connected to the ground via the switching transistor 442. Meanwhile, the voltage biasing circuit 420 outputs a bias voltage to the second output terminal 452 via the switching transistor 444.

The memory unit includes a selection circuit 46 and a plurality of pass transistors 402 to 406. The selection circuit 46 receives signals (bias voltage and ground voltage) from the first output terminal 450 and the second output terminal 452 so that potential levels on the bit lines 410 to 415 are determined. In this embodiment, a memory unit includes a first set of transistors 461 to 464, a second set of transistors 471 to 474, a plurality of bit lines and the pass transistors 402 to 406. The drain terminal of the transistor 471 and the source terminal of the transistor 472 are electrically coupled to the bit line 411. The source terminal of the transistor 471 and the drain terminal of the pass transistor 402 are electrically coupled to the bit line 410. The gate terminal of the transistor 471 receives a selection signal S2. The drain terminal of the transistor 470 and the drain terminal of the pass transistor 404 are electrically coupled to the bit line 412. The gate terminal of the transistor 472 receives a selection signal S1. The source terminal of the transistor 473 and the drain terminal of the pass transistor 404 are electrically coupled. The gate terminal of the transistor 473 receives a selection signal S3. The drain terminal of the transistor 474 and the drain terminal of the pass transistor 406 are electrically coupled to the bit line 414. The source terminal of the transistor 474 is electrically coupled to the bit line 413. The gate terminal of the transistor 474 receives the selection signal S2. The drain terminal of the transistor 461 is electrically coupled to the bit line 411 while the source terminal of the transistor 461 is electrically coupled to the first output terminal 450. The gate terminal of the transistor 461 receives the selection signal S2. The drain terminal of the transistor 462 is electrically coupled to the first output terminal 450 while the source terminal of the transistor 462 is electrically coupled to the bit line 411. The gate terminal of the transistor 462 receives the selection signal S1. The drain terminal of the transistor 463 is electrically coupled to the bit line 413 while the source terminal of the transistor 463 is electrically coupled to the first output terminal 450.

The gate terminal of the transistor 463 receives the selection signal S3. The drain terminal of the transistor 464 is electrically coupled to the second output terminal 452 while the source terminal of the transistor 464 is electrically coupled to the bit line 413. The gate terminal of the transistor 464 receives the selection signal S2. Note that although the first output terminal 450 and the second output terminal 452 in the memory unit are coupled to corresponding transistors in FIG. 4, this by no means restricts the circuit configuration. Other variations including the interchange of connections with the first output terminal 450 and the second output terminal 452 are also possible.

To read stored data from a memory cell, such as the transistor 472, the selection signal S2 and the switching signal SC2 are pulled to a high potential level. Hence, the transistors 442, 444, 461, 464, 471, 474 and 404 are all opened. The bit lines 410 and 411 are connected to a ground while the bit lines 413 and 414 are biased to a reference voltage level necessary for sensing via the voltage biasing circuit. Ultimately, a current path starting from the sense amplifier 400 and going through the transistor 404, the bit line 412, the transistor 472 and the ground-connected bit line 411 is established.

Figure 5:
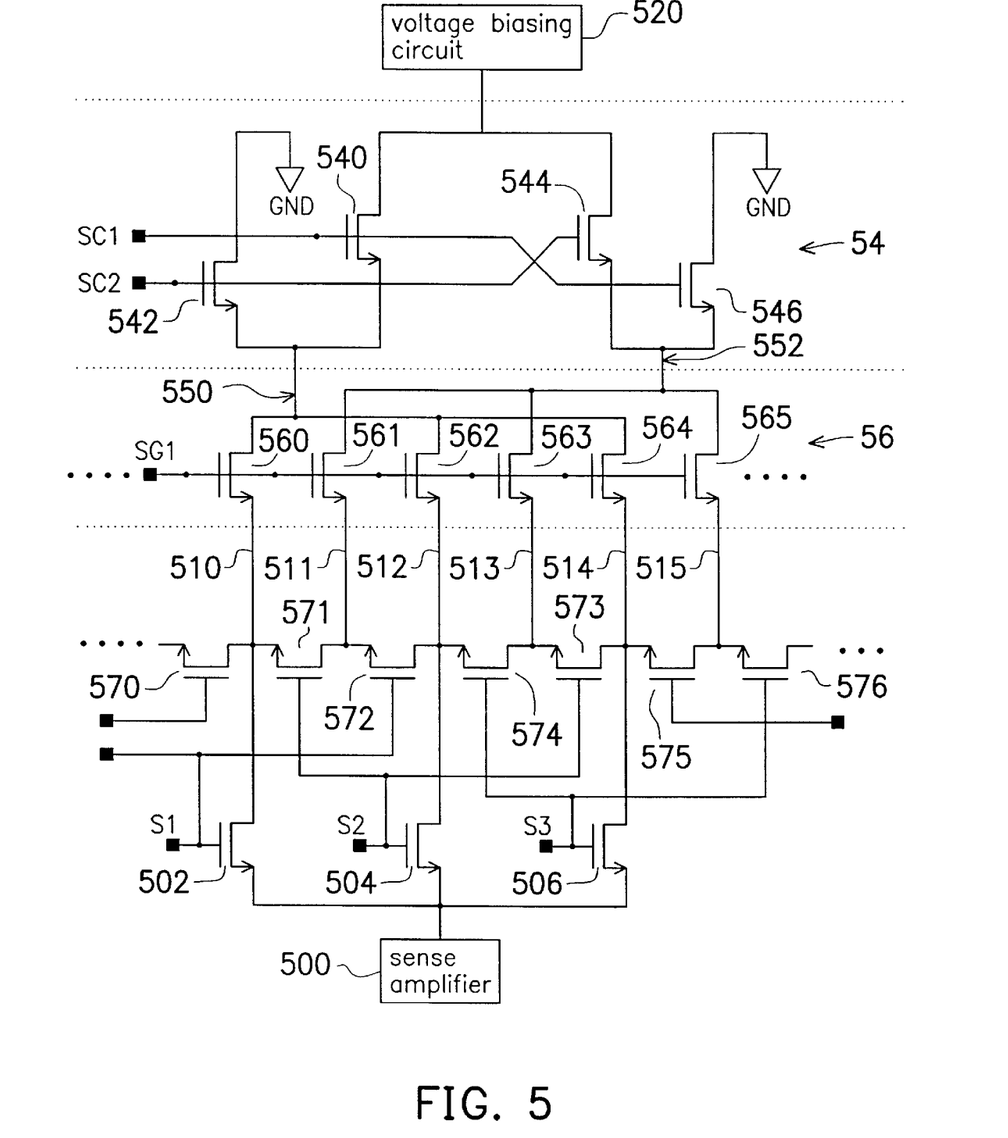
FIG. 5 is a schematic diagram showing a portion of the double protection virtual ground memory circuit that incorporates a column decoder according to a third preferred embodiment of this invention.

FIG. 5 is a schematic diagram showing a portion of the double protection virtual ground memory circuit that incorporates a column decoder according to a third preferred embodiment of this invention. In this embodiment, the circuit structure of the voltage biasing circuit 520 and the switching circuit 54 are similar to the voltage biasing circuit 420 and the switching circuit 44 shown in FIG. 4. Hence, in the following, only the selection circuit 56 is explained further.

The selection circuit 56 includes a plurality of transistors 560 to 565. The drain terminal of the transistor 560 is electrically coupled to a first output terminal 550 and the source terminal of the transistor 560 is electrically coupled to a bit line 510. The gate terminal of the transistor 560 receives a gate selection signal SG1. The drain terminal of the transistor 561 is electrically coupled to a second output terminal 552 and the source terminal of the transistor 561 is electrically coupled to a bit line 511. The gate terminal of the transistor 561 receives the gate selection signal SG1. The drain terminal of the transistor 562 is electrically coupled to the first output terminal 550 and the source terminal of the transistor 562 is electrically connected to a bit line 512. The gate terminal of the transistor 562 receives the gate selection signal SG1. The drain terminal of the transistor 563 is electrically coupled to the second output terminal 552 and the source terminal of the transistor 562 is electrically connected to a bit line 513. The gate terminal of the transistor 563 receives the gate selection signal SG1. The drain terminal of the transistor 564 is electrically coupled to the first output terminal 550 and the source terminal of the transistor 564 is electrically connected to a bit line 514. The gate terminal of the transistor 564 receives the gate selection signal SG1. Obviously, electrical connections with the first output terminal 550 and the second output terminal 552 may be interchanged without affecting the results.

Figure 6:
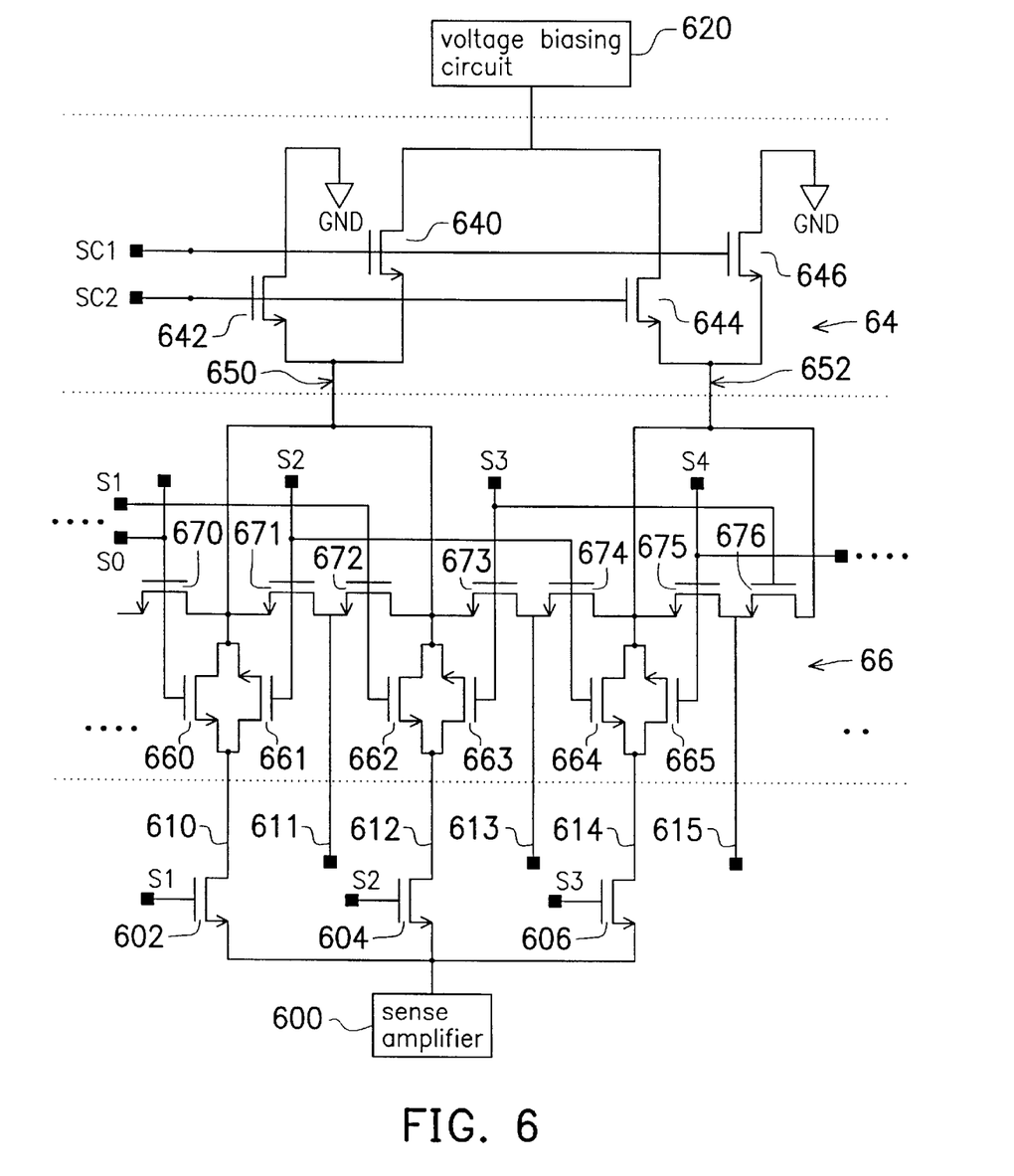
FIG. 6 is a schematic diagram showing a portion of the double protection virtual ground memory circuit that incorporates a column decoder according to a fourth preferred embodiment of this invention.

FIG. 6 is a schematic diagram showing a portion of the double protection virtual ground memory circuit that incorporates a column decoder according to a fourth preferred embodiment of this invention. In this embodiment, the circuit structure of the voltage biasing circuit 620 is similar to the voltage biasing circuits 420 and 520 in FIGS. 4 and 5. In addition, the switching circuit 64 is similar to the switching circuits 44 and 54 shown in FIGS. 4 and 5. Hence, in the following, only the selection circuit 66 is explained further.

The selection circuit 66 includes a plurality of transistors. The drain terminal of a transistor 661 and the drain terminal of a transistor 610 are electrically coupled to a bit line 610. The source terminal of the transistor 661 is electrically coupled to a first output terminal 650 of the switching circuit 64. The gate terminal of the transistor 661 receives a selection signal S2. The drain terminal of a transistor 662 is electrically coupled to the first output terminal 650 of the switching circuit 64. The source terminal of the transistor 662 and the drain terminal of a pass transistor 604 are electrically coupled to a bit line 612. The gate terminal of the transistor 662 receives a selection signal S1. The drain terminal of a transistor 663 is electrically coupled to a bit line 612. The source terminal of the transistor 663 is electrically coupled to the first output terminal 650 of the switching circuit 64. The gate terminal of the transistor 663 receives a selection signal S3. The drain terminal of a transistor 664 is electrically coupled to the second output terminal 652 of the switching circuit 64. The source terminal of the transistor 664 and the drain terminal of a pass transistor 606 are electrically coupled to a bit line 614. The gate terminal of the transistor 664 receives the second selection signal S2. The drain terminal of the transistor 671 is electrically coupled to a bit line 611 and the source terminal of the transistor 671 is electrically coupled to the first output terminal 650. The gate terminal of the transistor 671 receives the selection signal S2. The drain terminal of a transistor 672 is electrically coupled to the first output terminal 650 and the source terminal of the transistor 672 is electrically coupled to the bit line 611. The gate terminal of the transistor 672 receives the selection signal S1. The drain terminal of the transistor 673 is electrically coupled to a bit line 613 and the source terminal of the transistor 673 is electrically coupled to the first output terminal 650. The gate terminal of the transistor 673 receives the selection signal S3. The drain terminal of a transistor 674 is electrically coupled to the second output terminal 652 and the source terminal of the transistor 674 is electrically coupled to the bit line 613. The gate terminal of the transistor 673 receives the selection signal S2. Obviously, electrical connections with the first output terminal 650 and the second output terminal 652 may be interchanged without affecting the results.

In conclusion, one major advantage of the double ground-connected protection circuit of this invention is the production stable sense results. In addition, the column decoder design inside the circuit has low energy consumption and a simple and symmetrical design.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A double protection virtual ground memory circuit having at least a memory unit connected to a sense terminal of a sense amplifier for sensing memory cell data, comprising:

a first memory cell having a first conductive terminal, a second conductive terminal and a gate terminal, wherein the first conductive terminal of the first memory cell is electrically coupled to the sense terminal, the second conductive terminal of the first memory cell is coupled to a ground, and the gate terminal of the first memory cell is electrically coupled to a word line;

a second memory cell having a first conductive terminal, a second conductive terminal and a gate terminal, wherein the first conductive terminal of the second memory cell is electrically coupled to an output terminal of a voltage biasing circuit, the second conductive terminal of the second memory cell is electrically coupled to the sense terminal, and the gate terminal of the second memory cell is electrically coupled to the word line;

a third memory cell having a first conductive terminal, a second conductive terminal and a gate terminal, wherein the first conductive terminal of the third memory cell is electrically coupled to the second conductive terminal of the first memory cell, the second conductive terminal of the third memory cell is connected to the ground, and the gate terminal of the third memory cell is electrically coupled to the word line; and a fourth memory cell having a first conductive terminal, a second conductive terminal and a gate terminal, wherein the first conductive terminal of the fourth memory cell is electrically coupled to the output terminal of the voltage biasing circuit, the second conductive terminal of the fourth memory cell is electrically coupled to the first conductive terminal of the second memory cell, and the gate terminal of the fourth memory cell is electrically coupled to the word line.

2. A double protection virtual ground memory circuit having a sense amplifier for sensing memory cell data, comprising:

a plurality of bit lines;

a voltage biasing circuit for outputting a bias voltage;

a switching circuit having an input terminal, a first output terminal and a second output terminal, wherein the input terminal of the switching circuit receives the bias voltage and outputs different phase signals from the first output terminal and the second output terminal; and at least a memory unit, comprising:

a selection circuit for receiving the signals from the first output terminal and the second output terminal of the switching circuit and producing matching voltages on the bit lines according to selection;

a first pass transistor having a first conductive terminal, a second conductive terminal and a gate terminal, wherein the second conductive terminal of the first pass transistor couples electrically with the sense amplifier and the gate terminal of the first pass transistor receives a first selection signal;

a second pass transistor having a first conductive terminal, a second conductive terminal and a gate terminal, wherein the second conductive terminal of the second pass transistor couples electrically with the sense amplifier and the gate terminal of the second pass transistor receives a second selection signal; and a third pass transistor having a first conductive terminal, a second conductive terminal and a gate terminal, wherein the second conductive terminal of the third pass transistor couples electrically with the sense amplifier and the gate terminal of the third pass transistor receives a third selection signal.

3. The virtual ground memory circuit of claim 2, wherein the switching circuit includes:

a first switching transistor having a first conductive terminal, a second conductive terminal and a gate terminal, wherein the first conductive terminal of the first switching transistor receives the bias voltage, the second conductive terminal of the first switching transistor couples electrically with the first output terminal of the switching circuit, and the gate terminal of the first switching transistor receives a first switching control signal;

a second switching transistor having a first conductive terminal, a second conductive terminal and a gate terminal, wherein the first conductive terminal of the second switching transistor receives the bias voltage, the second conductive terminal of the second switching transistor couples electrically with the second output terminal of the switching circuit, and the gate terminal of the second switching transistor receives a second switching control signal;

a third switching transistor having a first conductive terminal, a second conductive terminal and a gate terminal, wherein the first conductive terminal of the third switching transistor connects with a ground terminal, the second conductive terminal of the third switching transistor couples electrically with the first output terminal of the switching circuit, and the gate terminal of the third switching transistor receives the second switching control signal; and a fourth switching transistor having a first conductive terminal, a second conductive terminal and a gate terminal, wherein the first conductive terminal of the fourth switching transistor connects with the ground terminal, the second conductive terminal of the fourth switching transistor couples electrically with the second output terminal of the switching circuit, and the gate terminal of the fourth switching transistor receives the first switching control signal.

4. The virtual ground memory circuit of claim 2, wherein the selection circuit includes:

a first transistor having a first conductive terminal, a second conductive terminal and a gate terminal, wherein the first conductive terminal of the first transistor and the first conductive terminal of the second pass transistor connect electrically with a first bit line of the bit lines, and the gate terminal of the first transistor receives the first selection signal;

a second transistor having a first conductive terminal, a second conductive terminal and a gate terminal, wherein the second conductive terminal of the second transistor connects electrically with the first conductive terminal of the second pass transistor, and the gate terminal of the second transistor receives the third selection signal;

a third transistor having a first conductive terminal, a second conductive terminal and a gate terminal, wherein the first conductive terminal of the third transistor and the second conductive terminal of the first transistor connect electrically with a second bit line of the bit lines, the second conductive terminal of the third transistor and the first conductive terminal of the first pass transistor connect electrically with a third bit line of the bit lines, and the gate terminal of the third transistor receives the second selection signal;

a fourth transistor having a first conductive terminal, a second conductive terminal and a gate terminal, wherein the first conductive terminal of the fourth transistor and the first conductive terminal of the third pass transistor connect electrically with a fourth bit line of the bit lines, the second conductive terminal of the fourth transistor connects electrically with a fifth bit line of the bit lines, and the gate terminal of the fourth transistor receives the second selection signal;

a fifth transistor having a first conductive terminal, a second conductive terminal and a gate terminal, wherein the first conductive terminal of the fifth transistor connects electrically with the first output terminal, the second conductive terminal of the fifth transistor connects electrically with the second bit line, and the gate terminal of the fifth transistor receives the first selection signal;

a sixth transistor having a first conductive terminal, a second conductive terminal and a gate terminal, wherein the first conductive terminal of the sixth transistor connects electrically with the fifth bit line, the second conductive terminal of the sixth transistor connects electrically with the first output terminal, and the gate terminal of the sixth transistor receives the third selection signal;

a seventh transistor having a first conductive terminal, a second conductive terminal and a gate terminal, wherein the first conductive terminal of the seventh transistor connects electrically with the second bit line, the second conductive terminal of the seventh transistor connects electrically with the first output terminal, and the gate terminal of the seventh transistor receives the second selection signal; and an eighth transistor having a first conductive terminal, a second conductive terminal and a gate terminal, wherein the first conductive terminal of the eighth transistor connects electrically with the second output terminal, the second conductive terminal of the eighth transistor connects electrically with the fifth bit line, and the gate terminal of the eighth transistor receives the second selection signal.

5. The virtual ground memory of claim 4, wherein the first conductive terminal of the fifth transistor, the second conductive terminal of the sixth transistor and the second conductive terminal of the seventh transistor connect electrically with the second output terminal, and the first conductive terminal of the eighth transistor connects electrically with the first output terminal.

6. The virtual ground memory of claim 2, wherein the circuit includes:

a first transistor having a first conductive terminal, a second conductive terminal and a gate terminal, wherein the first conductive terminal of the first transistor and the first conductive terminal of the second pass transistor connect electrically with a first bit line of the bit lines, the second conductive terminal of the first transistor connects electrically with a second bit line of the bit lines, and the gate terminal of the first transistor receives the first selection signal;

a second transistor having a first conductive terminal, a second conductive terminal and a gate terminal, wherein the first conductive terminal of the second transistor connects electrically with a third bit line of the bit lines, the second conductive terminal of the second transistor connects electrically with the first bit line, and the gate terminal of the second transistor receives the third selection signal;

a third transistor having a first conductive terminal, a second conductive terminal and a gate terminal, wherein the first conductive terminal of the third transistor connects electrically with the second bit line, the second conductive terminal of the third transistor and the first conductive terminal of the first pass transistor connects electrically with a fourth bit line of the bit lines, and the gate terminal of the third transistor receives the second selection signal; and a fourth transistor having a first conductive terminal, a second conductive terminal and a gate terminal, wherein the first conductive terminal of the fourth transistor and the first conductive terminal of the third transistor connect electrically with a fifth bit line of the bit lines, the second conductive terminal of the fourth transistor connects electrically with the third bit line, and the gate terminal of the fourth transistor receives the second selection signal.

7. The virtual ground memory of claim 6, wherein the selection circuit further includes:

a fifth transistor having a first conductive terminal, a second conductive terminal and a gate terminal, wherein the first conductive terminal of the fifth transistor connects electrically with the first output terminal, the second conductive terminal of the fifth transistor connects electrically with the fourth bit line, and the gate terminal of the fifth transistor receives a gate selection signal;

a sixth transistor having a first conductive terminal, a second conductive terminal and a gate terminal, wherein the first conductive terminal of the sixth transistor connects electrically with the second output terminal, the second conductive terminal of the sixth transistor connects electrically with the second bit line, and the gate terminal of the sixth transistor receives the gate selection signal;

a seventh transistor having a first conductive terminal, a second conductive terminal and a gate terminal, wherein the first conductive terminal of the seventh transistor connects electrically with the first output terminal, the second conductive terminal of the seventh transistor connects electrically with the first bit line, and the gate terminal of the seventh transistor receives the gate selection signal;

an eighth transistor having a first conductive terminal, a second conductive terminal and a gate terminal, wherein the first conductive terminal of the eighth transistor connects electrically with the second output terminal, the second conductive terminal of the eighth transistor connects electrically with the third bit line, and the gate terminal of the eighth transistor receives the gate selection signal; and a ninth transistor having a first conductive terminal, a second conductive terminal and a gate terminal, wherein the first conductive terminal of the ninth transistor connects electrically with the first output terminal, the second conductive terminal of the ninth transistor connects electrically with the fifth bit line, and the gate terminal of the ninth transistor receives the gate selection signal.

8. The virtual ground memory of claim 7, wherein the first conductive terminal of the fifth transistor, the first conductive terminal of the seventh transistor and the first conductive terminal of the ninth transistor connect electrically with the second output terminal, and the first conductive terminal of the sixth transistor and the first conductive terminal of the eighth transistor connect electrically with the first output terminal.

9. The virtual ground memory of claim 2, wherein the selection circuit includes:

a first transistor having a first conductive terminal, a second conductive terminal and a gate terminal, wherein the first conductive terminal of the first transistor connects electrically with the first output terminal of the switching circuit, the second conductive terminal of the first transistor and the first conductive terminal of the second pass transistor connect electrically with a first bit line of the bit lines, and the gate terminal of the first transistor receives the first selection signal;

a second transistor having a first conductive terminal, a second conductive terminal and a gate terminal, wherein the first conductive terminal of the second transistor and the first conductive terminal of the first pass transistor connect electrically with a second bit line of the bit lines, and the gate terminal of the second transistor receives the second selection signal;

a third transistor having a first conductive terminal, a second conductive terminal and a gate terminal, wherein the first conductive terminal of the third transistor connects electrically with the first bit line, the second conductive terminal of the third transistor connects electrically with the first output terminal of the switching circuit, and the gate terminal of the third transistor receives the third selection signal;

a fourth transistor having a first conductive terminal, a second conductive terminal and a gate terminal, wherein the first conductive terminal of the fourth transistor connects electrically with the second output terminal of the switching circuit, the second conductive terminal of the fourth transistor and the first conductive terminal of the third pass transistor connect electrically with a third bit line of the bit lines, and the gate terminal of the fourth transistor receives the second selection signal;

a fifth transistor having a first conductive terminal, a second conductive terminal and a gate terminal, wherein the first conductive terminal of the fifth transistor connects electrically with a fourth bit line of the bit lines, the second conductive terminal of the fifth transistor connects electrically with the first output terminal, and the gate terminal of the fifth transistor receives the second selection signal;

a sixth transistor having a first conductive terminal, a second conductive terminal and a gate terminal, wherein the first conductive terminal of the sixth transistor connects electrically with the first output terminal, the second conductive terminal of the sixth transistor connects electrically with the fourth bit line, and the gate terminal of the sixth transistor receives the first selection signal;

a seventh transistor having a first conductive terminal, a second conductive terminal and a gate terminal, wherein the first conductive terminal of the seventh transistor connects electrically with a fifth bit line of the bit lines, the second conductive terminal of the seventh transistor connects electrically with the first output terminal, and the gate terminal of the seventh transistor receives the third selection signal; and an eighth transistor having a first conductive terminal, a second conductive terminal and a gate terminal, wherein the first conductive terminal of the eighth transistor connects electrically with the second output terminal, the second conductive terminal of the eighth transistor connects electrically with the fifth bit line, and the gate terminal of the eighth transistor receives the second selection signal.

10. A column decoder inside a double protection virtual ground memory circuit, comprising:

a plurality of bit lines;

a voltage biasing circuit for outputting a bias voltage;

a switching circuit having an input terminal, a first output terminal and a second output terminal, wherein the input terminal of the switching circuit receives the bias voltage and outputs different phase signals from the first output terminal and the second output terminal; and a selection circuit for receiving signals from the first output terminal and the second output terminal of the switching circuit and assigning voltages to bit lines accordingly.

11. The column decoder of claim 10, wherein the selection circuit includes:

a first transistor having a first conductive terminal, a second conductive terminal and a gate terminal, wherein the first conductive terminal of the first transistor connects electrically with a first bit line of the bit lines, and the gate terminal of the first transistor receives a first selection signal;

a second transistor having a first conductive terminal, a second conductive terminal and a gate terminal, wherein the second conductive terminal of the second transistor connects electrically with the first bit line, and the gate terminal of the second transistor receives a second selection signal;

a third transistor having a first conductive terminal, a second conductive terminal and a gate terminal, wherein the first conductive terminal of the third transistor and the second conductive terminal of the first transistor connects electrically with a second bit line of the bit lines, the second conductive terminal of the third transistor connects electrically with a third bit line of the bit lines, and the gate terminal of the third transistor receives a third selection signal;

a fourth transistor having a first conductive terminal, a second conductive terminal and a gate terminal, wherein the first conductive terminal of the fourth transistor connects electrically with a fourth bit line of the bit lines, the second conductive terminal of the fourth transistor and the first conductive terminal of the second transistor connect electrically with a fifth bit line of the bit lines, and the gate terminal of the fourth transistor receives the third selection signal;

a fifth transistor having a first conductive terminal, a second conductive terminal and a gate terminal, wherein the first conductive terminal of the fifth transistor connects electrically with the first output terminal, the second conductive terminal of the fifth transistor connects electrically with the second bit line, and the gate terminal of the fifth transistor receives the first selection signal;

a sixth transistor having a first conductive terminal, a second conductive terminal and a gate terminal, wherein the first conductive terminal of the sixth transistor connects electrically with the fifth bit line, the second conductive terminal of the sixth transistor connects electrically with the first output terminal, and the gate terminal of the sixth transistor receives the second selection signal;

a seventh transistor having a first conductive terminal, a second conductive terminal and a gate terminal, wherein the first conductive terminal of the seventh transistor connects electrically with the second bit line, the second conductive terminal of the seventh transistor connects electrically with the first output terminal, and the gate terminal of the seventh transistor receives the third selection signal; and an eighth transistor having a first conductive terminal, a second conductive terminal and a gate terminal, wherein the first conductive terminal of the eighth transistor connects electrically with the second output terminal, the second conductive terminal of the eighth transistor connects electrically with the fifth bit line, and the gate terminal of the eighth transistor receives the third selection signal.

12. The column decoder of claim 10, wherein the selection circuit includes:

a first transistor having a first conductive terminal, a second conductive terminal and a gate terminal, wherein the first conductive terminal of the first transistor connects electrically with the first output terminal, the second conductive terminal of the first transistor connects electrically with a first bit line of the bit lines, and the gate terminal of the first transistor receives a gate selection signal;

a second transistor having a first conductive terminal, a second conductive terminal and a gate terminal, wherein the first conductive terminal of the second transistor connects electrically with the second output terminal, the second conductive terminal of the second transistor connects electrically with a second bit line of the bit lines, and the gate terminal of the second transistor receives the gate selection signal;

a third transistor having a first conductive terminal, a second conductive terminal and a gate terminal, wherein the first conductive terminal of the third transistor connects electrically with the first output terminal, the second conductive terminal of the third transistor connects electrically with a third bit line of the bit lines, and the gate terminal of the third transistor receives the gate selection signal;

a fourth transistor having a first conductive terminal, a second conductive terminal and a gate terminal, wherein the first conductive terminal of the fourth transistor connects electrically with the second output terminal, the second conductive terminal of the fourth transistor connects electrically with a fourth bit line of the bit lines, and the gate terminal of the fourth transistor receives the gate selection signal; and a fifth transistor having a first conductive terminal, a second conductive terminal and a gate terminal, wherein the first conductive terminal of the fifth transistor connects electrically with the first output terminal, the second conductive terminal of the fifth transistor connects electrically with a fifth bit line of the bit lines, and the gate terminal of the fifth transistor receives the gate selection signal.

13. The column decoder of claim 10, wherein the selection circuit includes:

a first transistor having a first conductive terminal, a second conductive terminal and a gate terminal, wherein the first conductive terminal of the first transistor connects electrically with the first output terminal, the second conductive terminal of the first transistor connects electrically with a first bit line of the bit lines, and the gate terminal of the first transistor receives a first selection signal;

a second transistor having a first conductive terminal, a second conductive terminal and a gate terminal, wherein the first conductive terminal of the second transistor connects electrically with a second bit line of the bit lines, the second conductive terminal of the second transistor connects electrically with the first output terminal, and the gate terminal of the second transistor receives a second selection signal;

a third transistor having a first conductive terminal, a second conductive terminal and a gate terminal, wherein the first conductive terminal of the third transistor connects electrically with the first output terminal, the second conductive terminal of the third transistor connects electrically with the second bit line, and the gate terminal of the third transistor receives a third selection signal;

a fourth transistor having a first conductive terminal, a second conductive terminal and a gate terminal, wherein the first conductive terminal of the fourth transistor connects electrically with the first bit line, the second conductive terminal of the fourth transistor connects electrically with the first output terminal, and the gate terminal of the fourth transistor receives a fourth selection signal;

a fifth transistor having a first conductive terminal, a second conductive terminal and a gate terminal, wherein the first conductive terminal of the fifth transistor connects electrically with the second output terminal, the second conductive terminal of the fifth transistor connects electrically with a third bit line of the bit lines, and the gate terminal of the fifth transistor receives the second selection signal;

a sixth transistor having a first conductive terminal, a second conductive terminal and a gate terminal, wherein the first conductive terminal of the sixth transistor connects electrically with the third bit line, the second conductive terminal of the sixth transistor connects electrically with the second output terminal, and the gate terminal of the sixth transistor receives a fifth selection signal;

a seventh transistor having a first conductive terminal, a second conductive terminal and a gate terminal, wherein the first conductive terminal of the seventh transistor connects electrically with a fourth bit line of the bit lines, the second conductive terminal of the seventh transistor connects electrically with the first output terminal, and the gate terminal of the seventh transistor receives the second selection signal;

an eighth transistor having a first conductive terminal, a second conductive terminal and a gate terminal, wherein the first conductive terminal of the eighth transistor connects electrically with the first output terminal, the second conductive terminal of the eighth transistor connects electrically with the fourth bit line, and the gate terminal of the eighth transistor receives the first selection signal;

a ninth transistor having a first conductive terminal, a second conductive terminal and a gate terminal, wherein the first conductive terminal of the ninth transistor connects electrically with a fifth bit line of the bit lines, the second conductive terminal of the ninth transistor connects electrically with the first output terminal, and the gate terminal of the ninth transistor connects with the fourth selection signal;

a tenth transistor having a first conductive terminal, a second conductive terminal and a gate terminal, wherein the first conductive terminal of the tenth transistor connects electrically with the second output terminal, the second conductive terminal of the tenth transistor connects electrically with the fifth bit line, and the gate terminal of the tenth transistor receives the second selection signal;

an eleventh transistor having a first conductive terminal, a second conductive terminal and a gate terminal, wherein the first conductive terminal of the eleventh transistor connects electrically with a sixth bit line of the bit lines, the second conductive terminal of the eleventh transistor connects electrically with the second output terminal, and the gate terminal of the eleventh transistor receives the fifth selection signal; and a twelfth transistor having a first conductive terminal, a second conductive terminal and a gate terminal, wherein the first conductive terminal of the twelfth transistor connects electrically with the second output terminal, the second conductive terminal of the twelfth transistor connects electrically with the sixth bit line, and the gate terminal of the twelfth transistor receives the fourth selection signal.

14. A double protection virtual ground memory circuit, comprising:

a plurality of bit lines;

a plurality of selection signal sources each outputting a selection signal; and a plurality of transistors, wherein each transistor has a first conductive terminal, a second conductive terminal and a gate terminal, the first conductive terminal and the second conductive terminal of each transistor is connected to a bit line while the gate terminal of the transistor is connected to one of the selection signal sources, wherein the plurality of transistors includes:

a first transistor having a first conductive terminal, a second conductive terminal and a gate terminal, wherein the first conductive terminal of the first transistor connects electrically with a first bit line of the bit lines, and the gate terminal of the first transistor receives a first selection signal from one of the selection signals;

a second transistor having a first conductive terminal, a second conductive terminal and a gate terminal, wherein the second conductive terminal of the second transistor connects electrically with the first bit line, and the gate terminal of the second transistor receives a second selection signal from one of the selection signals;

a third transistor having a first conductive terminal, a second conductive terminal and a gate terminal, wherein the first conductive terminal of the first transistor and the second conductive terminal of the first transistor connect electrically with a second bit line of the bit lines, the second conductive terminal of the third transistor connects electrically with a third bit line of the bit lines, and the gate terminal of the third transistor receives a third selection signal from one of the selection signals; and a fourth transistor having a first conductive terminal, a second conductive terminal and a gate terminal, wherein the first conductive terminal of the fourth transistor connects electrically with a fourth bit line of the bit lines, the second conductive terminal of the fourth transistor and the first conductive terminal of the second transistor connect electrically with a fifth bit line of the bit lines, and the gate terminal of the fourth transistor receives the third selection signal.

* * * * *